(12) United States Patent
Laporte et al.

(10) Patent No.: US 9,117,693 B2
(45) Date of Patent: Aug. 25, 2015

(54) PASSIVE INTEGRATED CIRCUIT

(75) Inventors: Claire Laporte, Tours (FR); Hilal Ezzeddine, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

(21) Appl. No.: 13/155,533

(22) Filed: Jun. 8, 2011

(65) Prior Publication Data

US 2011/0304014 A1  Dec. 15, 2011

(30) Foreign Application Priority Data

Jun. 10, 2010  (FR) ..................................... 10 54582

(51) Int. Cl.
| | |
|---|---|
| *H01L 27/01* | (2006.01) |
| *H01L 49/02* | (2006.01) |
| *H01L 23/522* | (2006.01) |
| *H01L 23/00* | (2006.01) |
| *H03H 5/02* | (2006.01) |

(52) U.S. Cl.
CPC .............. *H01L 28/10* (2013.01); *H01L 27/016* (2013.01); *H01L 28/60* (2013.01); *H01L 23/5223* (2013.01); *H01L 23/5227* (2013.01); *H01L 24/05* (2013.01); *H01L 2224/02166* (2013.01); *H01L 2224/0401* (2013.01); *H01L 2224/05571* (2013.01); *H01L 2224/05572* (2013.01); *H01L 2224/05644* (2013.01); *H01L 2224/05647* (2013.01); *H01L 2224/05655* (2013.01); *H01L 2224/05666* (2013.01); *H01L 2924/0002* (2013.01); *H01L 2924/00013* (2013.01); *H01L 2924/19011* (2013.01); *H03H 5/02* (2013.01)

(58) Field of Classification Search
CPC ................................. H01L 2224/0401; H01L 2224/05571–2224/05572; H01L 28/10; H01L 23/5223; H01L 2924/19011–2924/19043
USPC .......... 438/381, 393; 257/528, 531–533, 535, 257/E27.009, E27.113, E21.022
See application file for complete search history.

(56) References Cited

U.S. PATENT DOCUMENTS

| | | | | | |
|---|---|---|---|---|---|
| 3,858,126 | A | * | 12/1974 | Kameya ......................... | 333/138 |
| 5,719,070 | A | | 2/1998 | Cook et al. | |
| 5,726,485 | A | * | 3/1998 | Grass ............................ | 257/532 |
| 5,874,770 | A | * | 2/1999 | Saia et al. ..................... | 257/536 |
| 6,188,129 | B1 | * | 2/2001 | Paik et al. ..................... | 257/686 |
| 6,218,729 | B1 | * | 4/2001 | Zavrel et al. .................. | 257/698 |
| 6,255,714 | B1 | * | 7/2001 | Kossives et al. .............. | 257/528 |
| 6,380,608 | B1 | * | 4/2002 | Bentley ......................... | 257/531 |
| 7,305,223 | B2 | * | 12/2007 | Liu et al. ....................... | 455/333 |
| 7,589,392 | B2 | * | 9/2009 | Shastri et al. ................. | 257/532 |
| 7,674,646 | B2 | * | 3/2010 | Liu ................................ | 438/51 |
| 7,675,136 | B2 | * | 3/2010 | Kuwajima et al. ............ | 257/528 |
| 7,772,081 | B2 | * | 8/2010 | Lin et al. ....................... | 438/393 |
| 7,859,080 | B2 | * | 12/2010 | Kuwajima et al. ............ | 257/531 |
| 7,863,706 | B2 | * | 1/2011 | Lin ................................ | 257/528 |

(Continued)

OTHER PUBLICATIONS

French Search Report dated Jan. 24, 2011 from corresponding French Application No. 10/54582.

*Primary Examiner* — William F Kraig
*Assistant Examiner* — Maliheh Malek
(74) *Attorney, Agent, or Firm* — Allen, Dyer, Doppelt, Milbrath & Gilchrist, P.A.

(57) ABSTRACT

A passive integrated circuit formed on a substrate, including contact areas of a conductive material specifically capable of receiving bonding pads, wherein the conductive material further creates connections between regions of a lower metallization level.

14 Claims, 3 Drawing Sheets

(56) References Cited

U.S. PATENT DOCUMENTS

| | | | |
|---|---|---|---|
| 7,906,831 B2* | 3/2011 | Baumgartner et al. | 257/531 |
| 7,939,909 B2* | 5/2011 | Lee et al. | 257/531 |
| 8,058,950 B1* | 11/2011 | Senderowicz | 333/175 |
| 8,110,474 B2* | 2/2012 | Carobolante et al. | 438/381 |
| 8,110,477 B2* | 2/2012 | Lin et al. | 438/393 |
| 8,415,790 B2* | 4/2013 | Chen et al. | 257/724 |
| 8,853,819 B2* | 10/2014 | Chen et al. | 257/531 |
| 8,860,178 B2* | 10/2014 | Nakashiba | 257/531 |
| 2002/0192920 A1* | 12/2002 | Song | 438/381 |
| 2003/0112110 A1* | 6/2003 | Pavier | 336/96 |
| 2004/0080021 A1* | 4/2004 | Casper et al. | 257/528 |
| 2004/0238941 A1* | 12/2004 | Satoh et al. | 257/698 |
| 2004/0246692 A1 | 12/2004 | Satoh et al. | |
| 2005/0000729 A1* | 1/2005 | Iijima et al. | 174/260 |
| 2005/0105478 A1* | 5/2005 | Hwang et al. | 370/276 |
| 2005/0160575 A1* | 7/2005 | Gambino et al. | 29/602.1 |
| 2005/0236689 A1* | 10/2005 | Sugiura et al. | 257/531 |
| 2005/0237131 A1* | 10/2005 | Chang et al. | 333/175 |
| 2006/0006504 A1* | 1/2006 | Lee et al. | 257/666 |
| 2006/0114077 A1 | 6/2006 | Mizuno et al. | |
| 2006/0126254 A1* | 6/2006 | Auriel et al. | 361/118 |
| 2007/0139294 A1* | 6/2007 | Dunn et al. | 343/909 |
| 2007/0158818 A1* | 7/2007 | Tang et al. | 257/691 |
| 2007/0215962 A1* | 9/2007 | Minervini et al. | 257/414 |
| 2007/0228512 A1* | 10/2007 | Kuwajima et al. | 257/528 |
| 2007/0253144 A1* | 11/2007 | Kuwajima | 361/311 |
| 2008/0001285 A1* | 1/2008 | Yang | 257/724 |
| 2008/0002380 A1* | 1/2008 | Hazucha et al. | 361/760 |
| 2008/0055873 A1* | 3/2008 | Mi et al. | 361/761 |
| 2008/0122401 A1* | 5/2008 | Sato et al. | 320/107 |
| 2008/0122560 A1* | 5/2008 | Liu | 333/247 |
| 2008/0153245 A1* | 6/2008 | Lin et al. | 438/381 |
| 2008/0174976 A1 | 7/2008 | Satoh et al. | |
| 2009/0004807 A1* | 1/2009 | Chen et al. | 438/381 |
| 2009/0067116 A1* | 3/2009 | Fujii et al. | 361/303 |
| 2009/0170242 A1* | 7/2009 | Lin et al. | 438/107 |
| 2009/0179722 A1* | 7/2009 | Goyette et al. | 336/186 |
| 2009/0195335 A1* | 8/2009 | Wahl et al. | 333/24 R |
| 2009/0237894 A1 | 9/2009 | Ueda et al. | |
| 2010/0047990 A1* | 2/2010 | Edelstein et al. | 438/381 |
| 2010/0059853 A1* | 3/2010 | Lin et al. | 257/528 |
| 2010/0065942 A1* | 3/2010 | Lin et al. | 257/531 |
| 2010/0133652 A1* | 6/2010 | Atsumo | 257/531 |
| 2010/0140779 A1* | 6/2010 | Lin et al. | 257/690 |
| 2010/0165585 A1* | 7/2010 | Lin et al. | 361/748 |
| 2010/0181642 A1* | 7/2010 | Sarfaraz et al. | 257/528 |
| 2010/0237495 A1* | 9/2010 | Pagaila et al. | 257/700 |
| 2010/0244240 A1* | 9/2010 | Kapusta et al. | 257/737 |
| 2010/0264512 A1* | 10/2010 | Lin et al. | 257/528 |
| 2010/0264516 A1* | 10/2010 | Lin et al. | 257/531 |
| 2010/0328044 A1* | 12/2010 | Waffenschmidt et al. | 340/10.4 |
| 2011/0031583 A1* | 2/2011 | Akiba et al. | 257/531 |
| 2011/0115050 A1* | 5/2011 | Lin | 257/532 |
| 2011/0156204 A1* | 6/2011 | Chen et al. | 257/531 |
| 2011/0156247 A1* | 6/2011 | Chen et al. | 257/724 |
| 2011/0241163 A1* | 10/2011 | Liu et al. | 257/531 |
| 2012/0019192 A1* | 1/2012 | Sato et al. | 320/103 |
| 2012/0056297 A1* | 3/2012 | Akhtar et al. | 257/531 |
| 2012/0098621 A1* | 4/2012 | Nathawad | 333/175 |
| 2012/0119329 A1* | 5/2012 | Lin et al. | 257/531 |
| 2012/0175735 A1* | 7/2012 | Lin | 257/532 |
| 2012/0238069 A1* | 9/2012 | Voldman | 438/381 |
| 2014/0139958 A1* | 5/2014 | Chu et al. | 361/56 |

* cited by examiner

US 9,117,693 B2

PASSIVE INTEGRATED CIRCUIT

CROSS REFERENCE TO RELATED APPLICATIONS

This application claims the priority benefit of French patent application number 10/54582, filed on Jun. 10, 2010, entitled "PASSIVE INTEGRATED CIRCUIT," which is hereby incorporated by reference to the maximum extent allowable by law.

BACKGROUND OF THE INVENTION

1. Field of the Invention

The present invention relates to passive integrated circuits comprising, at the surface of a substrate, a stack of alternated insulating and conductive layers forming passive components such as inductances, capacitors, and couplers.

2. Discussion of the Related Art

Chips or integrated devices assembling passive components are known, which are specifically adapted to performing filtering, coupling, transformation, etc. functions. Such devices comprise, at the surface of a substrate, for example, a glass or silicon substrate, a stack of alternated insulating and conductive layers. These layers are etched to form desired elementary passive components. The components are interconnected via conductive tracks and vias formed in the stack of conductive and insulating layers. Further, conductive contact pads are provided at the surface of the stack to provide connections to the outside of the chip.

FIG. 1 is an electric diagram of a very simple passive circuit. It is a bandpass filter LC circuit. An inductance 10 is connected between terminals 14 and 15, and two capacitors 12 and 13 in series are connected between terminals 14 and 15, parallel to inductance 10.

FIGS. 2A to 2D schematically show an integrated circuit chip 20 corresponding to an embodiment of the circuit of FIG. 1. FIG. 2A is a top view, and FIGS. 2B, 2C, and 2D respectively are cross-section views along planes B-B, C-C, and D-D of FIG. 2A. It should be noted that the top view and the cross-section views do not strictly correspond. In particular, in the top view, the contours of some regions have been expanded or contracted to more easily make out these regions from corresponding regions of other metallization levels.

As appears from the cross-section views (FIGS. 2B to 2D), chip 20 comprises, at the surface of a substrate 21, a stack 23 of conductive and insulating layers. Stack 23 comprises, at a first distance from the surface of substrate 21, conductive copper regions of a first metallization level M1, and above level M1, other conductive copper regions of a second metallization level M2, with an insulating layer separating level M2 from level M1.

Chip 20 comprises a conductive winding 10 formed of a copper track of level M1. Winding 10 corresponds to inductance 10 of the diagram of FIG. 1.

As illustrated in FIGS. 2A and 2D, each of capacitors 12 and 13 of the diagram of FIG. 1 is formed of the stack of a lower electrode 24, of a layer of a dielectric material (respectively 26 and 27), and of an upper electrode (respectively 28 and 29). Lower electrode 24 is common to capacitors 12 and 13, thus creating a series connection between capacitors 12 and 13. Lower electrode 24 is formed of a conductive region, for example, made of copper, of a level lower than level M1, and upper electrodes 28 and 29 are formed of copper regions of level M1.

A conductive bridge 30 (FIGS. 2A and 2C), formed of a copper track of level M2, creates a connection between lower end 10i of winding 10 (level M1) and upper electrode 28 of capacitor 12 (level M1). Conductive vias 31 and 32, crossing the insulating layer which separates level M2 from level M1, are provided to connect bridge 30 (level M2) to regions 10i and 28 (level M1).

At the surface of chip 20, contact areas 14 and 15 are provided to create connections to the outside. Passive integrated circuits are generally intended to be assembled to other electronic devices by means of bonding pads welded to areas 14 and 15. Thus, areas 14 and 15 are made of a conductive material specifically capable of receiving bonding pads, and especially having a good adherence to the pads. Such a material is currently designated in the art as a UBM, for "Under Bump Metallization". It, for example, is a stack of a gold layer, of a copper layer, of a nickel layer, and of a titanium layer. Areas 14 and 15 are formed in openings made in an upper insulating layer which coats chip 20, and are in contact with copper regions 34 and 35 of metallization level M2. Region 34 is connected to bridge 30 by a conductive track of level M2, and region 35 is connected to outer end 10e of winding 10 (level M1) by a via 36.

Thus, inductance 10 is connected between areas 14 and 15, and series capacitors 12 and 13 are connected between areas 14 and 15, parallel to inductance 10.

In the chip manufacturing, all contact areas in the UBM material are made at the same time.

A disadvantage of this type of structure is that the chip manufacturing is relatively long and expensive. In particular, the forming of the metallizations of levels M1 and M2 comprises relatively long steps of electrolytic deposition of copper, resulting in a high cost of the chips.

SUMMARY OF THE INVENTION

Thus, an embodiment provides passive integrated devices overcoming at least some of the disadvantages of existing devices.

An embodiment provides passive integrated devices having a structure which is easier to manufacture than existing devices.

Thus, an embodiment provides a passive integrated circuit formed on a substrate, comprising contact areas of a conductive material specifically capable of receiving bonding pads, wherein said conductive material further creates connections between regions of a lower metallization level.

According to an embodiment, this circuit comprises at least one inductance formed of a winding made in said lower metallization level, the conductive material creating a connection between the inner end of the winding and a component of the circuit.

According to an embodiment, this component is a capacitor.

According to an embodiment, the conductive material is formed of the stack of a gold layer, a copper layer, a nickel layer, and a titanium layer.

According to an embodiment of the present invention, the lower metallization level is made of copper.

Another embodiment provides a method for manufacturing a passive integrated circuit, comprising the steps of: forming, above a substrate, first conductive regions of a first metallization level; and forming, above the first metallization level, second conductive regions of a conductive material specifically capable of receiving bonding pads, these second conductive regions forming: contact areas intended to ensure connections to the outside; and connections between first conductive regions.

According to an embodiment, this circuit comprises at least one inductance formed of a winding made in the first metallization level, said conductive material creating a connection between the inner end of the winding and a component of the circuit.

According to an embodiment, this component is a capacitor.

According to an embodiment of the present invention, the first metallization level is made of copper.

According to an embodiment, this method further comprises a preliminary step, at the design level, of decrease of the length of the connections between the first conductive regions.

The foregoing and other objects, features, and advantages will be discussed in detail in the following non-limiting description of specific embodiments in connection with the accompanying drawings.

DETAILED DESCRIPTION

Figure 1:
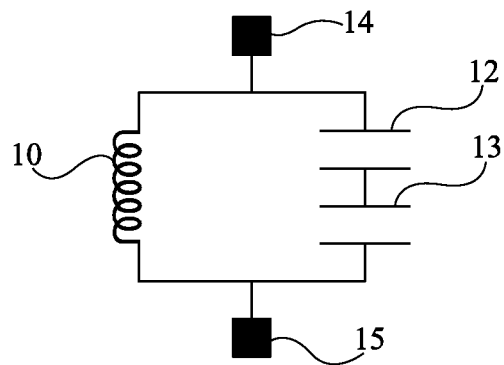
FIG. 1, previously described, is an electric diagram of a simple passive circuit.
Figure 2A:
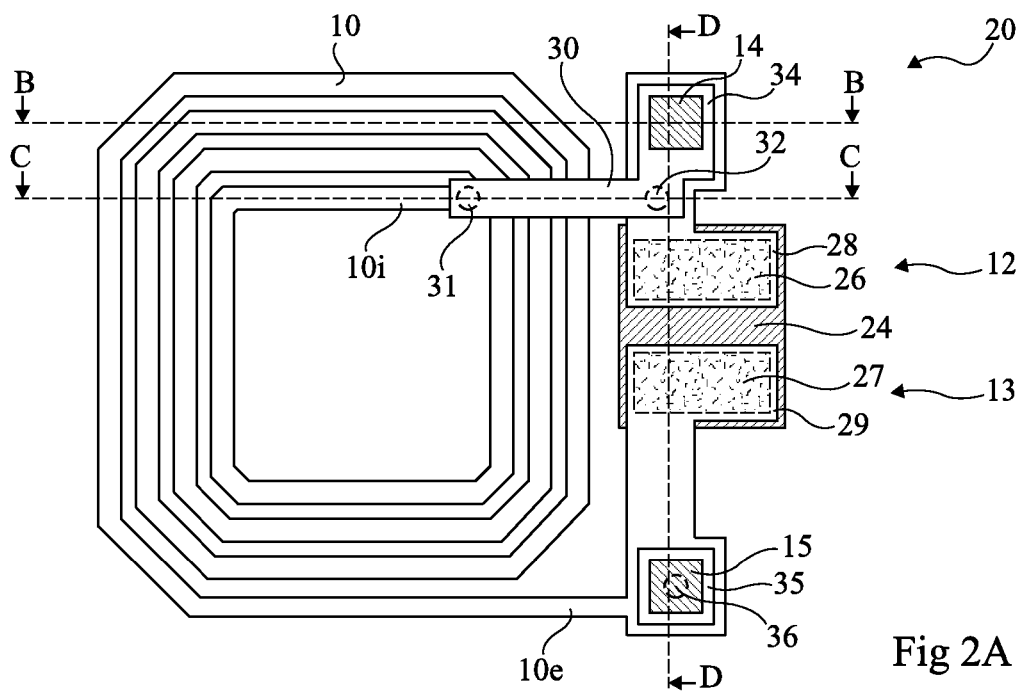
FIGS. 2A to 2D, previously described, are top and cross-section views schematically showing an integrated circuit chip corresponding to an embodiment of the circuit of FIG. 1.
Figure 2B:
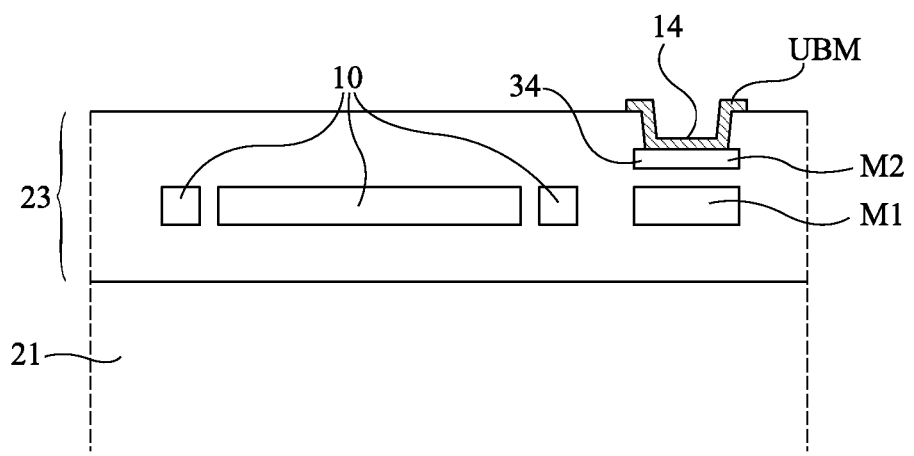
Figure 2C:
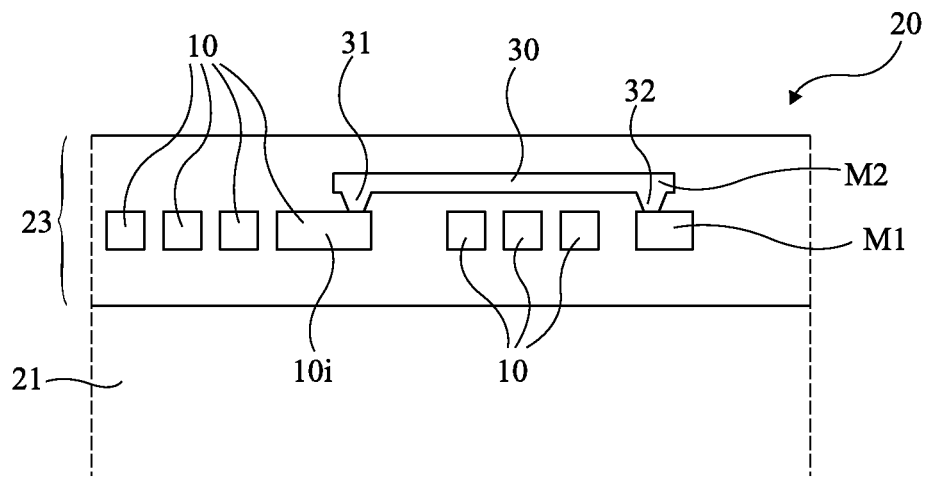
Figure 2D:
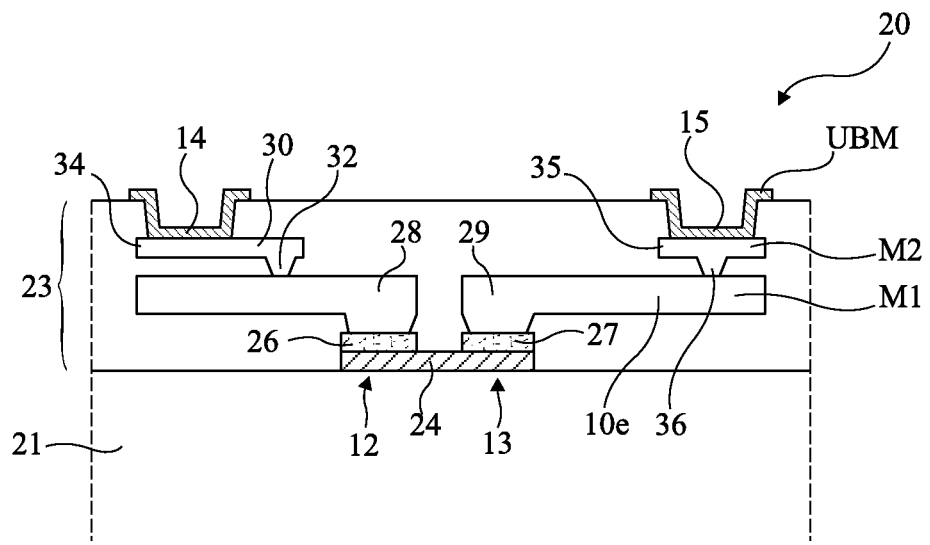

For clarity, the same elements have been designated with the same reference numerals in the different drawings and, further, as usual in the representation of integrated circuits, the various drawings are not to scale.

In passive integrated circuit 20 described in relation with FIGS. 2A to 2D, the metallizations of levels M1 and M2 are made of copper. This material is used due to its good electric conductivity. Relatively thick levels M1 and M2 are further used. As an example, the metallizations of level M1 have a thickness on the order of 6 μm and the metallizations of level M2 have a thickness on the order of 3 μm. Indeed, to form passive components, and especially to form inductances, it is important to use conductive regions having a very good conductivity.

It is here provided, to simplify the manufacturing of these circuits, to do without the upper metallization level (level M2 in the example of FIGS. 2A to 2D). To achieve this, as will be explained in further detail hereafter in relation with FIGS. 3A to 3C, the UBM-type conductive material is used, not only to form contact areas intended to ensure connections to the outside, but also to create connections between the circuit components.

UBM-type materials are capable of receiving bonding pads but are not as good conductors as the metallization levels currently used to form the components and interconnects of a circuit. UBM-type metallizations are especially thinner than the metallizations of the upper chip level (M2 in the above examples). As an example, an embodiment of a UBM-type metallization comprises a stack of a titanium layer having a 200-nm thickness, a nickel layer having a 650-nm thickness, a copper layer having a 700-nm layer thickness, and a 75-nm gold layer, this last layer forming the upper layer of the stack, intended to receive a bonding pad. Thus, such a metallization has a total thickness of approximately 1.5 μm, and a much lower conductivity than a copper layer of 3-μm thickness.

This lower conductivity is usually compensated for by the relatively large dimensions (in top view) of the contact areas intended to create connections to the outside.

The present inventors have observed that in many circuit configurations, the upper level to metallizations are only used to create connections, and not to form components. In the case of FIG. 2, only one short connection is made of metal of level M2. Further, in many existing circuits, slight modifications may be performed to decrease the length of upper level connections.

Trials made by the present inventors have enabled to show that the use of UBM-type materials to create short connections between components of a passive integrated circuit does not alter the performance of this circuit.

Figure 3A:
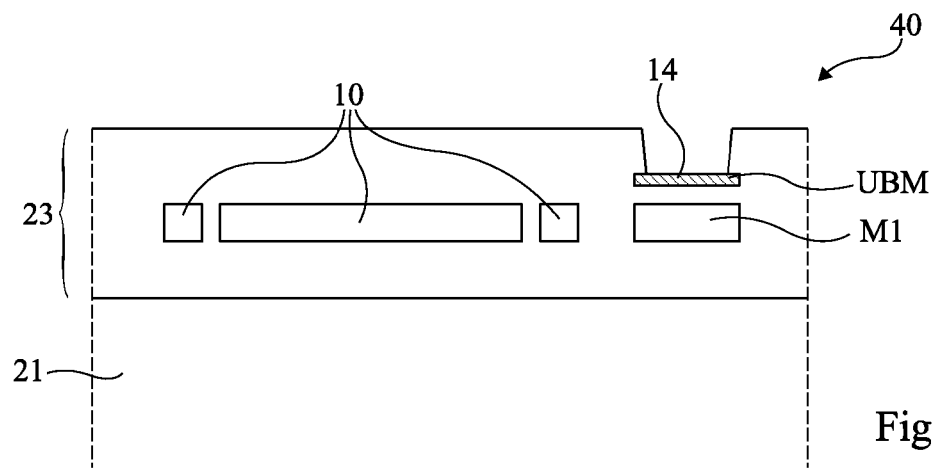
FIGS. 3A to 3C are cross-section views schematically showing an embodiment of an integrated circuit chip corresponding to the circuit of FIG. 1.
Figure 3B:
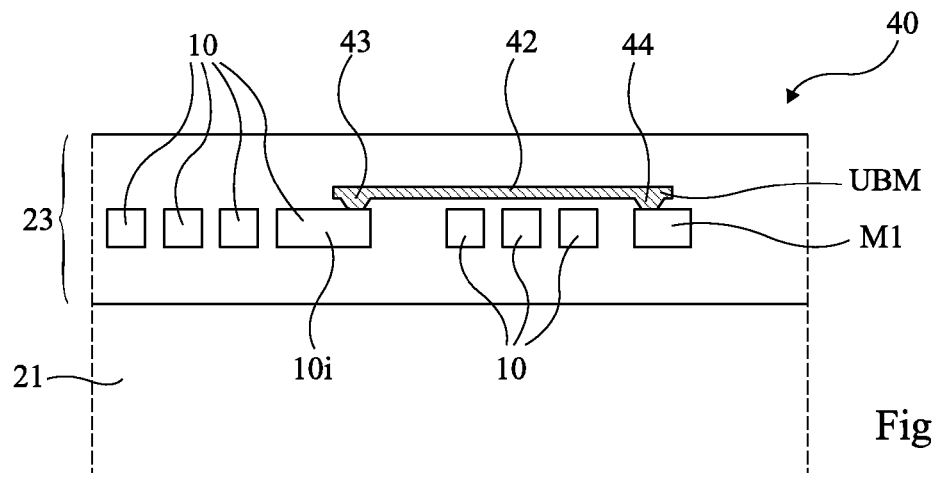
Figure 3C:
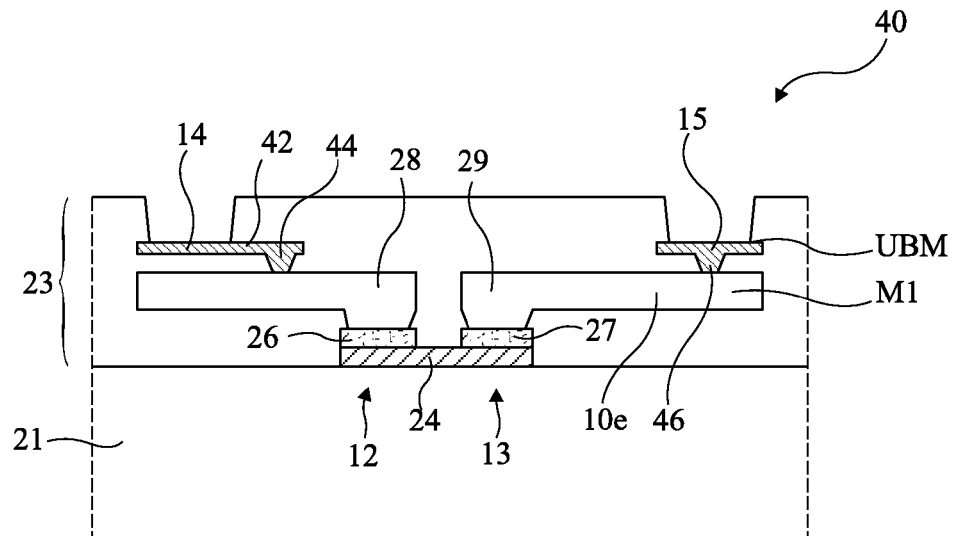

FIGS. 3A to 3C schematically show an embodiment of an integrated circuit chip 40 corresponding to the circuit of FIG. 1. FIGS. 3A, 3B, and 3C respectively are cross-section views of chip 40 along planes identical to the cross-section planes of FIGS. 2B, 2C, and 2D.

Chip 40 comprises, at the surface of a substrate 21, a stack 23 of insulating and conductive layers. Stack 23 comprises, above the surface of substrate 21, conductive regions, for example, made of copper, of a first metallization level M1. Above level M1, other conductive regions of a UBM-type material form:
    contact areas intended to ensure connections to the outside; and
    connections between regions of level M1, and especially between components of the chip, having at least one electrode formed in level M1.

Such conductive regions made of UBM-type material are arranged at a same level, which will simply be called UBM in the rest of the description. An insulating layer separates the UBM level from level M1.

Chip 40 comprises a conductive winding 10 formed of a metal track of level M1. Winding 10 corresponds to inductance 10 of the diagram of FIG. 1.

Each of capacitors 12 and 13 of the diagram of FIG. 1 is formed of the stacking of a lower electrode 24, of a layer of a dielectric material (respectively 26 and 27), and of an upper electrode (respectively 28 and 29). Lower electrode 24 is common to capacitors 12 and 13, thus creating a series connection between capacitors 12 and 13. Lower electrode 24 is formed of a conductive region of a level lower than level M1, and upper electrodes 28 and 29 are formed of metal regions of level M1.

A conductive bridge 42 (FIG. 3B), formed of a metal region of the UBM level, creates a connection between lower end 10i of winding 10 (level M1) and upper electrode 28 of capacitor 12 (level M1). Conductive vias 43 and 44, crossing the insulating layer which separates the UBM level from level M1, are provided to connect bridge 42 to regions 10i and 28.

At the surface of chip 40, contact areas 14 and 15, formed in the UBM level, are provided to create connections to the outside. Area 14 is connected to bridge 42, and area 15 is connected to outer end 10e of the winding (level M1) by a via 46.

Thus, inductance 10 is connected between areas 14 and 15, and series capacitors 12 and 13 are connected between areas 14 and 15, parallel to inductance 10.

An advantage of such a structure is that the chips are easier to manufacture than usual chips of the type described in relation with FIGS. 2A to 2D.

The manufacturing of chip 20 (FIGS. 2A to 2D) especially comprises the successive steps of:
    forming the metallizations of level M1;
    forming the metallizations of level M2;

coating the chip with an insulating layer;
forming openings in the insulating layer in front of metal regions of level M2; and
forming, in the openings, contact areas of a UBM-type material, intended to provide connections to the outside.

The manufacturing of chip 40 described in relation with FIGS. 3A to 3C especially comprises the successive steps of:
forming the metallizations of level M1;
forming the metallizations of the UBM level;
coating the chip with an insulating layer;
forming openings in the insulating layer in front of conductive regions of the UBM level intended to provide connections to the outside.

The provided structure thus enables to do without one step, that is, the forming of an upper copper metallization level.

Further, the manufacturing of the provided structure comprises, first, the forming of the contact areas of the UBM level and, second, the forming of openings in the upper insulating layer in front of these contact areas. This enables obtaining contact pads of small dimensions with respect to usual devices. Indeed, the manufacturing of usual structures of the type described in relation with FIGS. 2A to 2D comprises, first, the forming of openings in the upper insulating layer in front of metal regions of level M2 and, second, the forming of contact areas by deposition of a UBM-type material in these openings. The UBM-type material then also covers the walls of the openings and may extend at the surface of the insulating layer, at the to periphery of the openings. The contact pads thus have larger dimensions than in the provided structure, and a greater distance should thus be provided between two pads and/or between a pad and the chip edge, to prevent any short-circuit risk.

Specific embodiments have been described. Various alterations, modifications and improvements will readily occur to those skilled in the art.

In particular, examples of passive integrated circuits corresponding to a very simple electric diagram (diagram of FIG. 1) have been described hereabove. The present invention is not limited to this specific case. It will be within the abilities of those skilled in the art to use the provided structure to form any other passive integrated device in which the upper level metallizations essentially comprise short interconnect tracks between components formed in lower levels, and towards contact areas capable of providing connections to the outside. The integrated circuit may especially comprise other components than inductances and capacitors.

In the above-described examples, it has been provided to replace copper metallizations of level M2 with a UBM-type material. The present invention is not limited to this specific case. The upper metallization level which is provided to be replaced with a UBM may be another level than level M2 and may be formed of another material than copper.

Further, an example of composition of a UBM-type material has been given hereabove. It will be within the abilities of those skilled in the art to form the provided structure by using UBM-type materials of different compositions.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:
1. A passive integrated circuit comprising:
a substrate;
a first layer of conductive material being on said substrate, said first layer of conductive material defining an inductor, and upper electrodes of a plurality of capacitors;
a second layer of a conductive material
being above and in contact with said first layer of conductive material, and
comprising a plurality of contact areas configured to receive a plurality of bonding pads,
said second layer of conductive material comprising a stack of a titanium layer, a nickel layer, a copper layer, and a gold layer;
said second layer of conductive material defining connections between separated regions of the inductor and defining connections between the upper electrodes of the plurality of capacitors.

2. The circuit of claim 1, wherein the inductor comprises a winding; and wherein said second layer of conductive material defines a connection between an end of the winding and a component.

3. The circuit of claim 1, wherein said second layer of conductive material has a thickness of about 1.5 μm.

4. The circuit of claim 1, wherein the first layer of conductive material comprises copper.

5. A method for making a passive integrated circuit, the method comprising:
forming, at a substrate, first conductive regions of a first metallization layer;
forming an inductor and upper electrodes of a plurality of capacitors only in the first metallization layer; and
forming, above the first metallization layer, second conductive regions of a second layer of conductive material capable of receiving a plurality of bonding pads, the second conductive regions having portions in direct physical contact with the first metallization layer;
said second layer of conductive material comprising a stack of a titanium layer, a nickel layer, a copper layer, and a gold layer, the second conductive regions
defining connections between separated regions of the inductor formed in the first metallization layer, and
defining connections between the upper electrodes of the plurality of capacitors formed in the first metallization layer.

6. The method of claim 5, wherein the inductor comprises a winding, said second conductive regions creating a connection between an end of the winding and a component of the passive integrated circuit.

7. The method of claim 5, wherein the first metallization layer comprises copper.

8. The method of claim 5, further comprising at the design level, decreasing a length of the connections.

9. A method for forming a passive integrated circuit, the method comprising:
depositing a first metallization layer;
forming an inductor winding in the first metallization layer;
forming upper electrodes of a plurality of capacitors in the first metallization layer;
depositing a second metallization layer comprising a stack of a titanium layer, a nickel layer, a copper layer, and a gold layer;
at least one portion of the second metallization layer being in direct physical contact with the first metallization layer and coupling at least two separated elements of the inductor and the upper electrodes of the plurality of capacitors; and
forming a plurality of contact pads for receiving a plurality of bonding pads in the second metallization layer and being beneath an insulating layer, the plurality of contact pads to be accessed through a plurality of vias in the insulating layer.

10. The method of claim 9, further comprising depositing copper as the first metallization layer.

11. The method of claim 10, further comprising depositing the copper to a thickness of about 6 microns.

12. The method of claim 9, further comprising depositing the second metallization layer to a thickness of about 1.5 microns.

13. The method of claim 9, further comprising:
depositing the insulating layer over the second metallization layer; and
forming the plurality of vias through the insulating layer to expose the plurality of contact pads.

14. The circuit of claim 9, wherein the plurality of contact pads do not extend onto sidewalls of the plurality of vias.

* * * * *